United States Patent [19]

Wilber

[11] Patent Number: 5,089,755
[45] Date of Patent: Feb. 18, 1992

[54] VERTICAL DEFLECTION CIRCUIT

[75] Inventor: James A. Wilber, Indianapolis, Ind.

[73] Assignee: Thomson Consumer Electronics, Inc., Indianapolis, Ind.

[21] Appl. No.: 660,188

[22] Filed: Feb. 19, 1991

[51] Int. Cl.$^5$ .......................... G09G 1/04; H01J 29/70
[52] U.S. Cl. ...................................... 315/387; 315/403
[58] Field of Search ...................... 315/387, 403, 408

[56] References Cited

U.S. PATENT DOCUMENTS 4,795,949  1/1989  Wilber .................................. 315/397
4,884,012  11/1989  Leonardi ............................. 315/397

OTHER PUBLICATIONS

A Data Sheet for Integrated Circuit TDA8178 made by SGB-Thomson Microelectronics, dated Jun. 1989.
A Preliminary Data Sheet for Integrated Circuit (IC) TDA8170, dated Apr. 1986.
Schemiatic diagram, pp. 289-290 of a manual of a CTC 131 television receiver chassis produced by RCA Corporation.

*Primary Examiner*—Gregory C. Issing
*Attorney, Agent, or Firm*—Joseph S. Tripoli; Joseph J. Laks; Sammy S. Henig

[57] ABSTRACT

A vertical amplifier of a vertical deflection circuit has an output transistor operating as a conductive switch that couples a boosted supply voltage to a vertical deflection winding during vertical retrace. A feedback network that bypasses the deflection winding is coupled between an output terminal and an input terminal of the amplifier to provide a phase lead. A clamping diode is coupled to the feedback network. The clamping diode reduces a magnitude of a feedback signal, during vertical retrace, in a manner to delay an instant in which the output transistor begins operating as an amplifier stage. The lengthening of vertical retrace due to the feedback signal is thereby reduced.

15 Claims, 1 Drawing Sheet

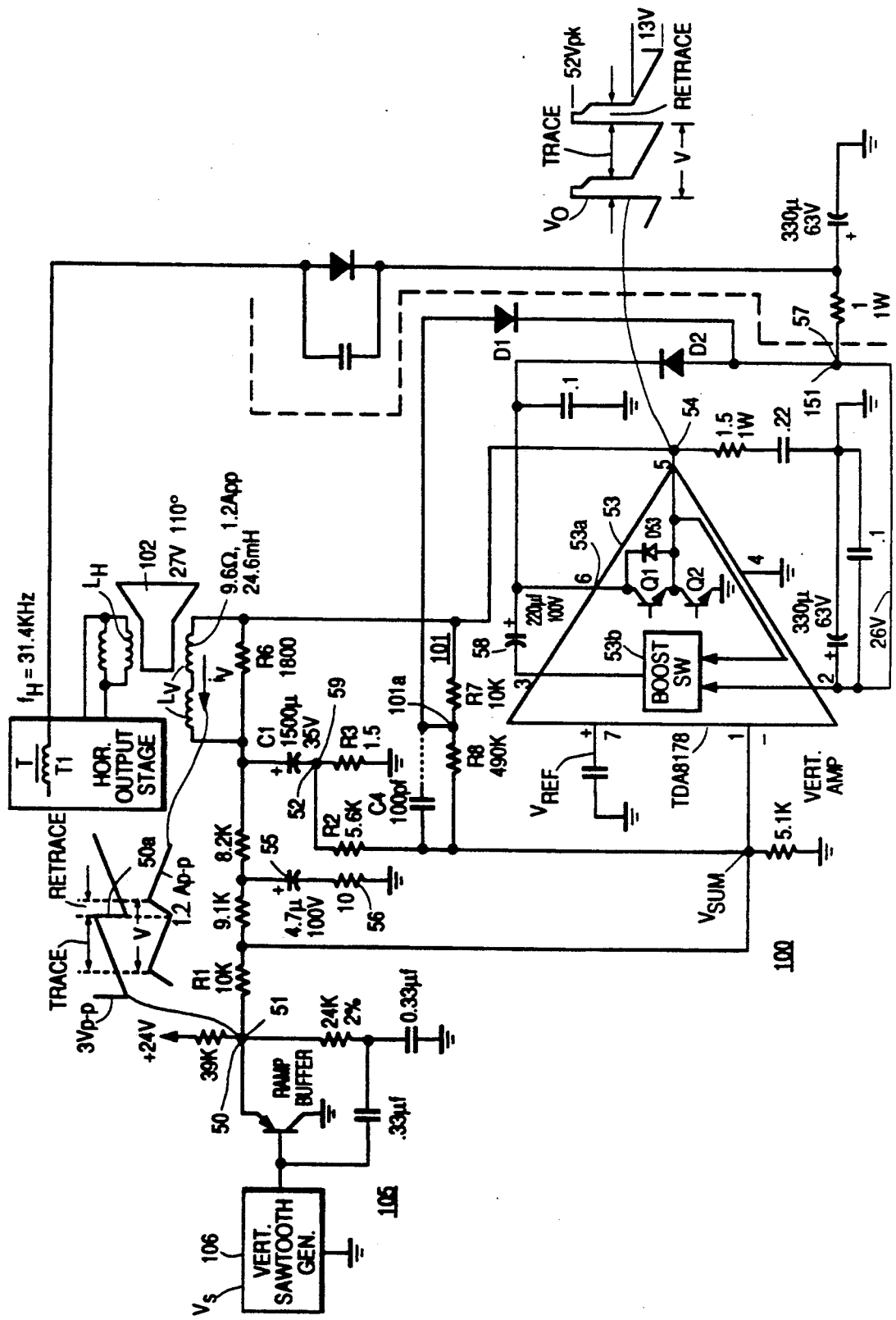

VERTICAL DEFLECTION CIRCUIT

The invention relates to a deflection circuit of a video apparatus.

Typically, a vertical deflection circuit of, for example, a television receiver includes an amplifier referred to as the vertical amplifier having a push-pull output stage. An output terminal of the push-pull output stage is coupled to a series arrangement of a vertical deflection winding, a DC blocking capacitor and a deflection current sampling resistor for producing a vertical deflection current in the series arrangement. A sawtooth feedback voltage developed in the sampling resistor and a sawtooth input voltage are coupled to an input of the amplifier to form a closed loop feedback operation mode, during vertical trace.

During vertical retrace, one of the transistors of the push-pull output stage operates as a switch to couple a boosted-up supply voltage to the deflection winding that causes the deflection current to reverse its polarity. After the deflection current reverses its polarity and attains approximately a peak value, that transistor begins operating as an amplifier stage and the vertical amplifier operates again in the closed loop feedback operation mode. Thus, vertical trace is resumed.

In a vertical deflection circuit embodying an aspect of the invention, to provide phase lead compensation in the closed loop operation mode, required for frequency stability, and to reduce the effect of cross talk from a horizontal deflection winding, a feedback network is coupled between an output and an input of the vertical amplifier. Disadvantageously, such feedback network could cause the vertical retrace interval to lengthen. This is so because the feedback network produces a feedback signal that changes the operation of the aforementioned transistor from operating as a switch to operating as an amplifier stage at an instant that occurs earlier in the vertical retrace interval than warranted by the level of the deflection current at that instant. It may be desirable to reduce the effect of the feedback network on the length of the vertical retrace interval.

A deflection circuit of a video display apparatus, embodying an aspect of the invention, includes a deflection winding and a source of a sawtooth input signal at a frequency that is related to a deflection frequency. A deflection amplifier is responsive to the sawtooth input signal, to a feedback signal generated in a feedback network and to a third signal for generating an output voltage at an output terminal that is coupled to the deflection winding to generate a deflection current in the deflection winding. The operation of the amplifier in a closed-loop feedback mode is disable during a retrace portion of a given deflection cycle. The operation of the amplifier in the closed-loop feedback mode is resumed following the retrace portion of the given deflection cycle at an instant that is determined in accordance with the sawtooth input signal, the feedback signal and the third signal. Switching arrangement has a first switching state during the trace portion and a second switching state during the retrace portion of the deflection cycle for generating the third signal that varies the instant within the deflection cycle when the operation of the amplifier in the closed-loop feedback mode is resumed.

The sole FIGURE illustrates a vertical deflection circuit, embodying an aspect of the invention.

The sole FIGURE illustrates a vertical deflection circuit 100, embodying an aspect of the invention, of a television receiver. Vertical deflection circuit 100 produces a vertical deflection current $i_V$ in a vertical deflection winding $L_V$ that is coupled in series with a DC blocking capacitor C1 and a deflection current sampling resistor R3 to provide vertical deflection in a cathode ray tube 102. A feedback sawtooth voltage 52 is produced across deflection current sampling resistor R3. A vertical sync signal $V_S$ is coupled to a sawtooth generator 106 of a stage 105 to produce in a well known manner a sawtooth voltage 50 at a terminal 51. Voltage 50 is coupled via a resistor R1 and voltage 52 is coupled via a resistor R2 to an inverting input terminal of a vertical deflection amplifier 53 to develop a voltage $V_{SUM}$. Amplifier 53 produces control signals at the base electrodes of NPN output transistors Q1 and Q2, coupled in a push-pull configuration, in accordance with a voltage difference between voltage $V_{SUM}$ and a constant DC voltage $V_{REF}$, developed at a noninverting input terminal of amplifier 53. The emitter of transistor Q1 and the collector of transistor Q2 are coupled together to an output terminal 54 of amplifier 53. The series arrangement of vertical deflection winding $L_V$, DC blocking capacitor C1 and deflection current sampling resistor R3 is coupled between terminal 54 and a common conductor or ground. Sawtooth voltage 52 is produced at a terminal 59, between capacitor C1 and resistor R3.

Substantially throughout vertical trace, deflection current $i_V$ varies proportionally to the variation of sawtooth voltage 50. Thus, at a given instant, the level of current $i_V$ corresponds to a predetermined level of voltage 50.

During the second half of each vertical trace interval, transistor Q1 is nonconductive and transistor Q2 conducts vertical deflection current $i_V$ that flows in vertical deflection winding $L_V$ in a direction opposite to the arrow. At the end vertical trace, a negative going transition 50a occurs in sawtooth input voltage 50. Consequently, transistor Q2 is turned-off and transistor Q1 is turned on, in saturation and operates as a conductive switch. During the first half of vertical retrace, current $i_V$ flows through a diode D53 that is coupled in anti-parallel manner between the emitter and collector electrodes of transistor Q1 from terminal 54 to a supply voltage receiving terminal 53a of amplifier 53. During the second half of vertical retrace, current $i_V$ flows through transistor Q1 in a direction that is opposite, with respect to terminal 53b, than in the first last half of vertical retrace.

A supply voltage 57 at a terminal 151 that is produced in a well known manner by rectifying a voltage developed in a tertiary winding T1 of a horizontal flyback transformer T energizes amplifier 53. Supply voltage 57 is coupled via a forward biased diode D2 to terminal 53a, during vertical trace. During vertical retrace, a retrace portion of an output voltage $V_O$ of amplifier 53 developed at terminal 54 becomes larger than voltage 57, causing a conventional retrace boost switch 53b to couple a voltage across a capacitor 58 in series with voltage 57 to develop a boosted supply voltage at terminal 53a. Capacitor 58 develops across its terminals a voltage that is equal to voltage 57 via the operation of boost switch 53b, in a well known manner. As a result of the operation of boost switch 53a, the supply voltage at terminal 53a is equal to twice the value of voltage 57, as long as the voltage at terminal 54 is larger than voltage 57. Output voltage $V_O$ at terminal 54 of amplifier 53 becomes equal approximately to the boosted supply voltage at terminal 53a, during vertical retrace. During vertical retrace, the closed loop feedback mode in amplifier 53 is disabled because the feedback causes the drive to Q1 to be so large as to result in transistor Q1 operating as a conductive switch, for example, in saturated conduction.

During vertical retrace, voltage $V_O$ at terminal 54 causes deflection current $i_V$ to change from peak negative, at the beginning of retrace, to becoming peak positive, at the end of retrace, in a ramping manner. The feedback provided through winding $L_V$ and resistor R3 causes voltage $V_{SUM}$ to become increasingly positive toward the end of vertical retrace. Near the end of retrace, when voltage $V_{SUM}$ at the inverting input terminal of amplifier 53 is at a threshold level of amplifier 53, by becoming, for example, more positive than voltage $V_{REF}$, transistor Q1 begins operating as an amplifier stage, instead of as a switch. Later on, when voltage $V_O$ becomes smaller than voltage 57, boost switch 53b causes the supply voltage at terminal 53a to become approximately equal to voltage 57.

The main feedback path for amplifier 53 is provided through winding $L_V$ and resistor R3. Phase lead compensation in amplifier 53 required for stable closed loop operation and to provide, for example, critical damping, is provided by an internal compensation network in amplifier 53, by a resistor R6 that is coupled across winding $L_V$ and by a feedback network 101 that bypasses winding $L_V$. Network 101 includes resistors R7 and R8 coupled in series between terminal 54 of amplifier 53 and the inverting input terminal of amplifier 53. A junction terminal 101a is coupled between resistors R7 and R8. A phase lead providing capacitor C4 may be coupled across resistor R8, between terminal 101a and the inverting input terminal of amplifier 53, as shown in a broken line.

Voltage coupling or cross talk from a horizontal deflection winding $L_H$ to vertical deflection winding $L_V$ may occur. Due to current feedback, the output impedance of amplifier 53 in the closed loop operation at the high frequencies of the voltage that is coupled from winding $L_H$ is high. Therefore, if network 101 and resistor R6 were not used, the voltage coupled from winding $L_H$ could have caused amplifier 53 to produce voltage $V_O$ at an undesirable significant magnitude. Such significant magnitude of voltage $V_O$ at the high frequencies of the voltage coupled from winding $L_H$ could have produced an undesirable change in current $i_V$ that could degrade normal interlace feature in cathode ray tube 102. By providing additional feedback paths to the voltage that is coupled from winding $L_H$, via resistor R6 and network 101, the voltage gain of amplifier 53 with respect to the high frequencies of the voltage coupled from winding $L_H$ is, advantageously, reduced.

In order to maintain the length of the vertical retrace short, it may be desirable to maintain the operation of transistor Q1 in a saturated state, during the second half of vertical retrace as long as current $i_V$ has not attained, for example, a peak positive level that corresponds with the level of sawtooth voltage 50, at the beginning of vertical trace.

The current in network 101 or resistor R6 could cause voltage $V_{SUM}$ to attain the threshold level and, thereby, could cause transistor Q1 to cease operating as a conductive stage and resume operating as an amplifier stage, prior to an instant when current $i_V$ attains the peak positive level that corresponds with the level of sawtooth voltage 50. If transistor Q1 were to cease operating as a saturated switch prior to the instant when current $i_V$ attains the peak positive level, voltage $V_O$ would become smaller than the boosted supply voltage prior to such instant. The result would be that the rate by which current $i_V$ increases relative to a desirable situation in which output voltage $V_O$ is equal to the boosted supply voltage as long as current $i_V$ has not attained the positive peak level would be reduced. Therefore, the length of vertical retrace, that ends when current $i_V$ attains the peak positive level, would, disadvantageously, increase.

In accordance with an aspect of the invention, a clamping diode D1 operating as a switch is coupled between terminal 101a and terminal 151 where voltage 57 is developed. During vertical trace, diode D1 is in a disabled, nonconductive state and has no effect on the operation of vertical deflection circuit 100. During vertical retrace, diode D1 is in a conductive state and clamps the voltage at terminal 101a to approximately the level of voltage 57. Thereby, the voltage at terminal 101a that is produced by diode D1 and that is coupled to the inverting input terminal of amplifier 53 is substantially reduced from what it would have been absent the clamping operation of diode D1. This is so because without diode D1 the voltage at terminal 101a would have been approximately twice the level of voltage 57. The voltage clamping operation of diode D1 causes voltage $V_{SUM}$ to attain the threshold level and to cause transistor Q1 to cease operating as a conductive switch, advantageously, later in the vertical retrace interval than if diode D1 were absent. Thus, diode D1 produces time shifting of the instant when closed-loop operation mode of amplifier 53 is resumed. Therefore, voltage $V_O$ is maintained at the level of the boosted supply voltage for a longer period than without diode D1. The result is that current $i_V$ attains its peak positive value earlier in the deflection cycle than if diodes D1 were absent. Consequently, the length of the retrace interval is, advantageously, reduced relative to a situation in which diode D1 is not employed.

What is claimed is:

1. A deflection circuit of a video display apparatus, comprising:

a deflection winding for conducting therein a deflection current;

a source of a sawtooth input signal at a frequency that is related to a deflection frequency;

a deflection amplifier responsive to said sawtooth input signal, to a feedback signal that is indicative of a magnitude of said deflection current generated in a feedback network and to a third signal for generating an output voltage at an output terminal that is coupled to said deflection winding to generate a deflection current in said deflection winding, the operation of said amplifier in a closed-loop feedback mode being disabled during a retrace portion of said given deflection cycle, the operation of said amplifier in a closed-loop feedback mode being resumed following said retrace portion of said given deflection cycle at an instant that is determined in accordance with said sawtooth input signal, said feedback signal and said third signal, each being applied to a corresponding input of said amplifier; and switching means having a first switching state during said trace portion and a second switching state during said retrace portion of said deflection cycle for generating said third signal that varies said instant within said deflection cycle when the operation of said amplifier in said closed-loop feedback mode is resumed.

2. A deflection circuit according to claim 1 wherein the generation of said third signal is disabled during said trace portion to prevent said third signal from affecting said deflection current.

3. A deflection circuit according to claim 1 wherein said third signal is coupled to an input terminal of said amplifier via said feedback network.

4. A deflection circuit according to claim 1 wherein said third signal delays said instant when the operation in said closed loop feedback mode is resumed in said given cycle.

5. A deflection circuit according to claim 1 wherein, at an end of said retrace portion, said deflection current magnitude attains a magnitude that corresponds with a beginning trace level of said input signal, and wherein said feedback signal tends to delay the resumption of the operation in said closed loop feedback mode until said deflection current attains said magnitude.

6. A deflection circuit according to claim 1 wherein said feedback network includes a first signal path that includes said vertical deflection winding and a second signal path that bypasses said vertical deflection winding, and wherein said third signal is coupled to said input terminal of said amplifier via said second signal path.

7. A deflection circuit according to claim 6 wherein said second signal path of said feedback network provides phase compensation in said amplifier.

8. A deflection circuit according to claim 6 wherein a portion of said feedback signal that is coupled via said second signal path of said feedback network reduces an effect on a vertical deflection current of signal coupling from a horizontal deflection winding to a vertical deflection winding.

9. A deflection circuit according to claim 1 wherein said amplifier includes an output transistor that couples in a conductive switching state thereof a supply voltage to said deflection winding to speed-up a rate of change of said deflection winding, during said retrace portion.

10. A deflection circuit according to claim 1 further comprising, first and second resistors coupled in series between an output terminal and an input terminal of said amplifier and wherein said switching means comprises a voltage clamping diode having a first terminal that is coupled between said resistors and a second terminal that is coupled to a supply voltage.

11. A deflection circuit according to claim 1 wherein said deflection winding is a vertical deflection winding.

12. A deflection circuit of a video display apparatus, comprising:
a deflection winding for conducting a deflection current therein;
a source of a sawtooth input signal at a frequency that is related to a deflection frequency;
a deflection amplifier responsive to said sawtooth input signal for generating an output voltage at an output terminal that is coupled to said deflection winding to generate said deflection current in said deflection winding;
a feedback network coupled to said deflection winding and to an input terminal of said amplifier for producing a feedback signal at said input terminal that is indicative of said deflection current; and
switching means having a first switching state during a trace portion and a second switching state during said retrace potion of said deflection cycle for producing a third signal that is developed at a corresponding input of said amplifier.

13. A deflection circuit according to claim 12 wherein said switching means provides a clamping action to a DC voltage source.

14. A deflection circuit of a video display apparatus, comprising:
a deflection winding for conducting a deflection current therein;
a source of a sawtooth input signal at a frequency that is related to a deflection frequency;
a deflection amplifier responsive to said input signal and having an output terminal that is coupled to said deflection winding to generate said deflection current in said deflection winding;
a feedback network coupled to an input terminal of said amplifier for generating a feedback signal during a trace portion of a given deflection cycle; and
switching means coupled to said feedback network via a signal path that bypasses said output terminal of said amplifier for varying said feedback signal during a retrace portion of said cycle such that, during said trace portion, said switching means is in an inactive state to prevent said switching means from varying said feedback signal.

15. A deflection circuit of a video display apparatus, comprising:
a deflection winding for conducting a deflection current therein;
a source of a sawtooth input signal at a frequency that is related to a deflection frequency;
a deflection amplifier responsive to said sawtooth input signal, to a feedback signal that is indicative of a magnitude of said deflection current and to a phase compensation output signal for generating an output voltage at an output terminal that is coupled to said deflection winding to generate said deflection current in said deflection winding;
a phase compensation network coupled to an input terminal of said amplifier for producing said phase compensation output signal that provides phase compensation in said amplifier; and
means operative only during a portion of each deflection cycle and coupled to said phase compensation network for controlling a magnitude of said phase compensation output signal of said phase compensation network.

* * * * *